United States Patent
Subramanian et al.

(10) Patent No.: US 6,667,899 B1
(45) Date of Patent: Dec. 23, 2003

(54) MAGNETIC MEMORY AND METHOD OF BI-DIRECTIONAL WRITE CURRENT PROGRAMMING

(75) Inventors: Chitra K. Subramanian, Austin, TX (US); Thomas W. Andre, Austin, TX (US); Joseph J. Nahas, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/401,195

(22) Filed: Mar. 27, 2003

(51) Int. Cl.[7] .............................................. G11C 11/15
(52) U.S. Cl. ........................ 365/158; 365/173; 365/171; 365/230.07; 365/225.5
(58) Field of Search ................................. 365/158, 173, 365/171, 230.06, 230.07, 189.08, 225.5

(56) References Cited

U.S. PATENT DOCUMENTS

| | | | |
|---|---|---|---|
| 4,831,427 A | * | 5/1989 | Coleman, Jr. ............... 365/171 |
| 5,936,882 A | * | 8/1999 | Dunn .......................... 365/158 |
| 5,946,227 A | | 8/1999 | Naji ........................... 365/158 |
| 6,111,781 A | | 8/2000 | Naji ........................... 365/158 |
| 6,272,041 B1 | | 8/2001 | Naji ........................... 365/171 |
| 6,335,890 B1 | | 1/2002 | Reohr et al. ............. 365/225.5 |
| 6,545,906 B1 | * | 4/2003 | Savtchenko et al. ........ 365/158 |

OTHER PUBLICATIONS

U.S. patent application Ser. No. 09/978,859 entitled "A Method of Writing to a Scalable Magnetoresistance Random Access Memory Element," filed Oct. 16, 2001 and assigned to assignee hereof.
U.S. patent application Ser. No. 10/186,141 entitled "Circuit and Method of Writing a Toggle Memory," filed Jun. 28, 2002 and assigned to assignee hereof.
U.S. patent application Ser. No. 10/185,868 entitled "MRAM Architecture with Electrically Isolated Read and Write Circuitry," filed Jun. 28, 2002 and assigned to assignee hereof.

* cited by examiner

*Primary Examiner*—Andrew Q. Tran
(74) *Attorney, Agent, or Firm*—Robert L. King

(57) ABSTRACT

A magnetic memory (400) is programmed by selectively conducting current in opposite directions in both word and bit lines to reduce electromigration effects in word lines and bit lines. Various criteria, such as a data value being programmed and a previous current direction are used to determine the direction of the write currents used in the word and bit lines during programming.

17 Claims, 10 Drawing Sheets

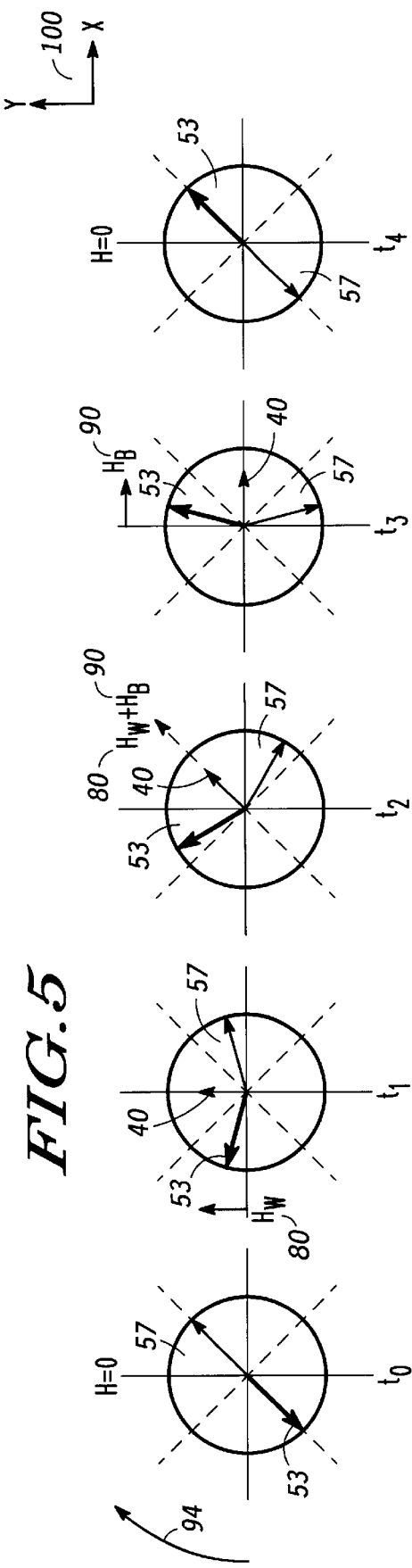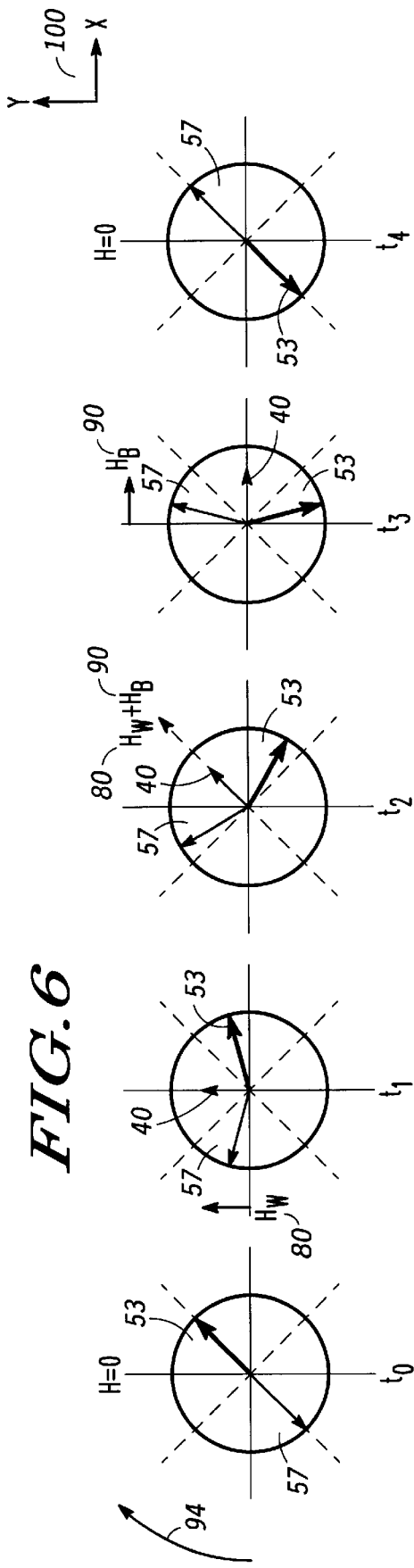

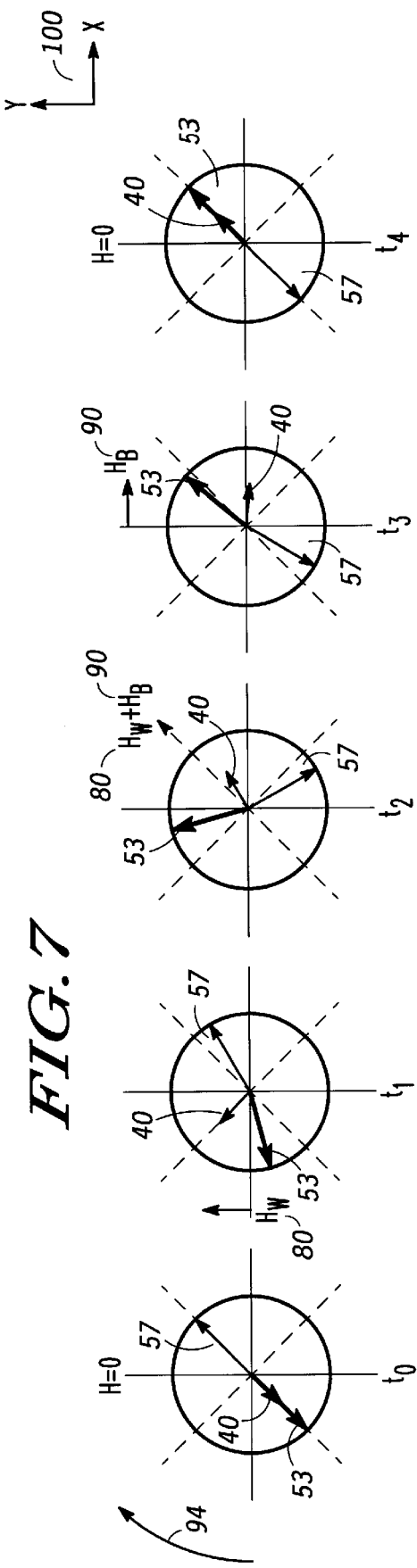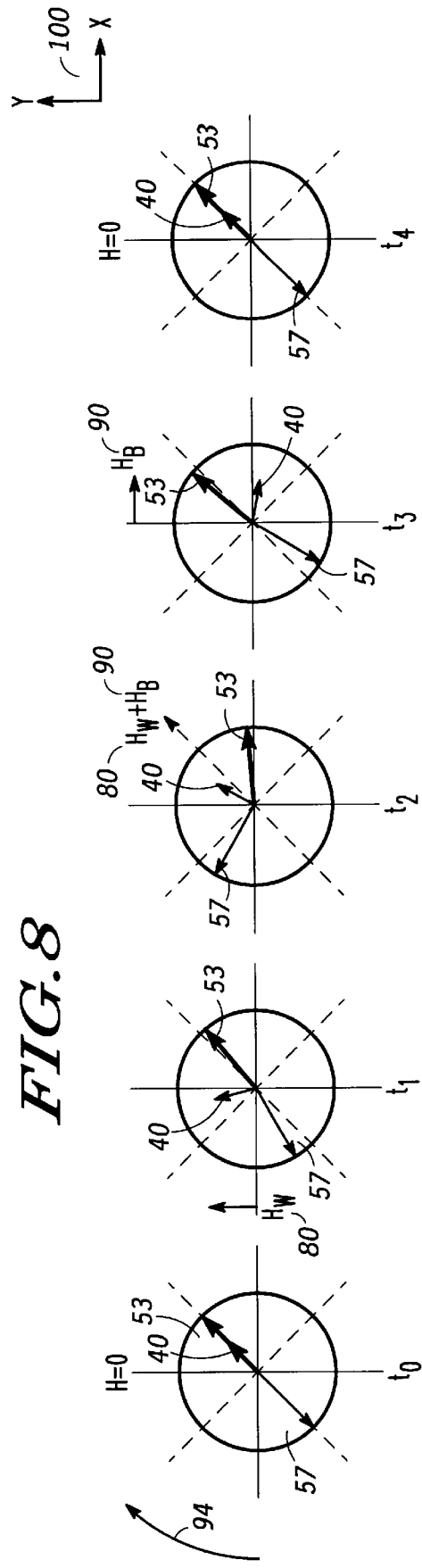

US 6,667,899 B1

MAGNETIC MEMORY AND METHOD OF BI-DIRECTIONAL WRITE CURRENT PROGRAMMING

RELATED APPLICATIONS

This application is related to:

U.S. patent application Ser. No. 09/978,859, entitled "Method of Writing to a Scalable Magnetoresistance Random Access Memory Element," filed Oct. 16, 2001, now U.S. Pat. No. 6,595,906 and assigned to the assignee hereof;

U.S. patent application Ser. No. 10/186,141, entitled "Circuit and Method of Writing a Toggle Memory," filed Jun. 28, 2002, now allowed, and assigned to the assignee hereof; and U.S. patent application Ser. No. 10/185,868, entitled "MRAM Architecture With Electrically Isolated Read and Write Circuitry," filed Jun. 28, 2002, now pending, and assigned to the assignee hereof.

FIELD OF THE INVENTION

This invention relates to Magnetoresistive Random Access Memories (MRAMs), and more particularly to programming of MRAMs.

BACKGROUND OF THE INVENTION

A magnetoresistive RAM (hereinafter referred to as "MRAM") is a magnetic memory device. A memory state in an MRAM is not maintained by electrical power, but rather by the direction of the magnetic polarization of magnetic materials. Storing data is accomplished by applying magnetic fields and causing a magnetic material in a MRAM device to be magnetized into either of two possible memory states. Reading data from the memory is accomplished by sensing the resistance differences in the MRAM device between the two states. The magnetic fields for writing are created by passing currents through metal lines external to the magnetic structure. Some MRAMs are toggle memories that are programmed by either reversing the state of the memory cells or leaving them in the same logic state. In order to determine which of these is chosen, the logic state to be written must be compared to the state that is already present. If the outcome of the comparison is that the logic state must be reversed, the write sequence is performed. If the logic state is to stay the same, a write sequence is not performed.

A write or program operation of MRAM bits requires high current densities through the metal lines to create magnetic fields external to the magnetic structure. With extended use, high current densities result in significant movement of atoms in the metal lines leaving resulting atomic voids. The presence of increased holes changes the resistivity of the metal lines thereby resulting in electromigration (EM) failures. The result is a modification of the operation of the MRAM and the likelihood of failed operation.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the bit current when both are turned on;

FIG. 5 is a diagram illustrating the rotation of the magnetic moment vectors for a magnetoresistive random access memory device for the toggle write mode when writing a '1' to a '0';

FIG. 6 is a diagram illustrating the rotation of the magnetic moment vectors for a magnetoresistive random access memory device for the toggle write mode when writing a '0' to a '1';

FIG. 7 is a graph illustrating the rotation of the magnetic moment vectors for a magnetoresistive random access memory device for the direct write mode when writing a '1' to a '0';

FIG. 8 is a graph illustrating the rotation of the magnetic moment vectors for a magnetoresistive random access memory device for the direct write mode when writing a '0' to a state that is already a '0';

FIG. 9 is a graph illustrating the timing diagram of the word current and the bit current when only the bit current is turned on;

FIG. 10 is a graph illustrating the rotation of the magnetic moment vectors for a magnetoresistive random access memory device when only the bit current is turned on;

DETAILED DESCRIPTION

A memory architecture uses separate word lines for the read and write operations as well as separate bit lines for the read and write operations and is grouped into groups of bits with common local read bit lines. The groups are further folded so that two groups that are selectively coupled to the same global bit line share the same word lines. These characteristics provide the benefits of smaller write driver area, smaller average bit size for the memory core, allowing overlap between read and write operations, reduced global bit line capacitance, and higher voltage writing.

Figure 1:
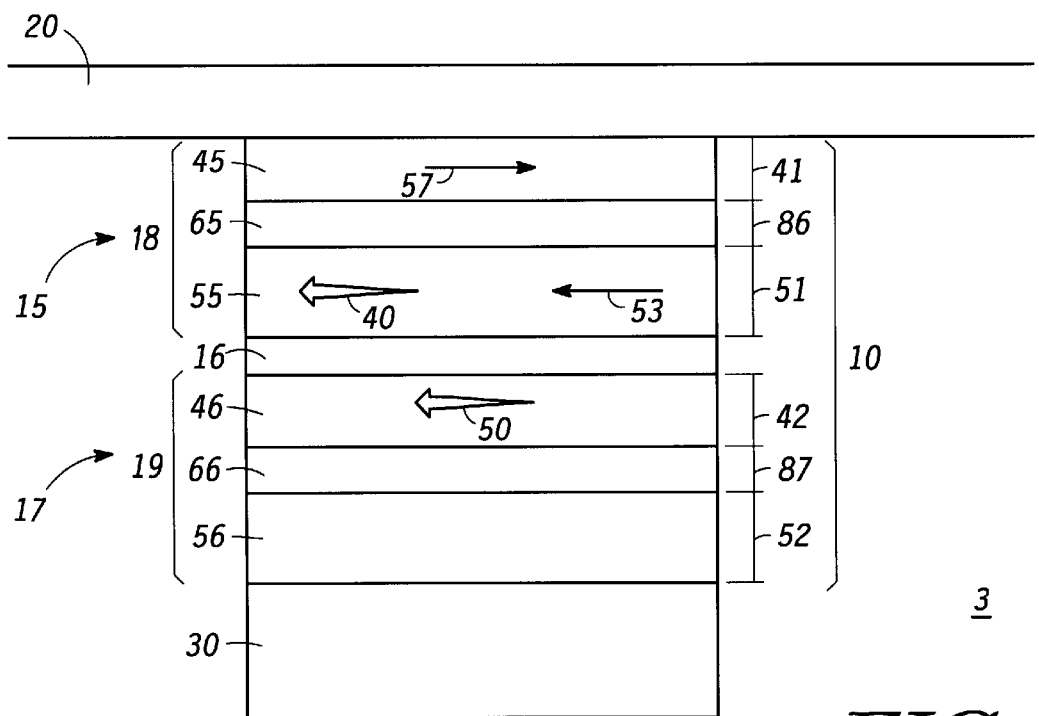
FIG. 1 is a simplified sectional view of a magnetoresistive random access memory device.

Turn now to FIG. 1, which illustrates a simplified sectional view of an MRAM array 3. In this illustration, only a single magnetoresistive memory device is shown, but it will be understood that MRAM array 3 consists of a number of MRAM devices such as MRAM device 10 and we are showing only one such device for simplicity in describing the writing method.

MRAM device 10 includes a write word line 20 and a write bit line 30. Write word line 20 and write bit line 30 include conductive material such that a current can be passed therethrough. In this illustration, write word line 20 is positioned on top of MRAM device 10 and write bit line 30 is positioned on the bottom of MRAM device 10 and is directed at a 90° angle to word line 20 (See FIG. 2). As an alternative, write word line 20 may be positioned on the bottom of MRAM device 10 and write bit line 30 may be positioned on top of MRAM device 10.

MRAM device 10 includes a tunnel junction comprising a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 between two ferromagnetic layers 45 and 55. Anti-ferromagnetic coupling spacer layer 65 has a thickness 86, and ferromagnetic layers 45 and 55 have thicknesses 41 and 51, respectively. Further, magnetic region 17 has a tri-layer structure 19, which has an anti-ferromagnetic coupling spacer layer 66 between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic (SAF) layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40, and magnetic region 17 has a resultant magnetic moment vector 50. Resultant magnetic moment vectors 40 and 50 are oriented along an anisotropy easy-axis in a direction that is at an angle, preferably 45°, from write word line 20 and write bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between write word line 20 and write bit line 30, as will be discussed presently.

Figure 2:
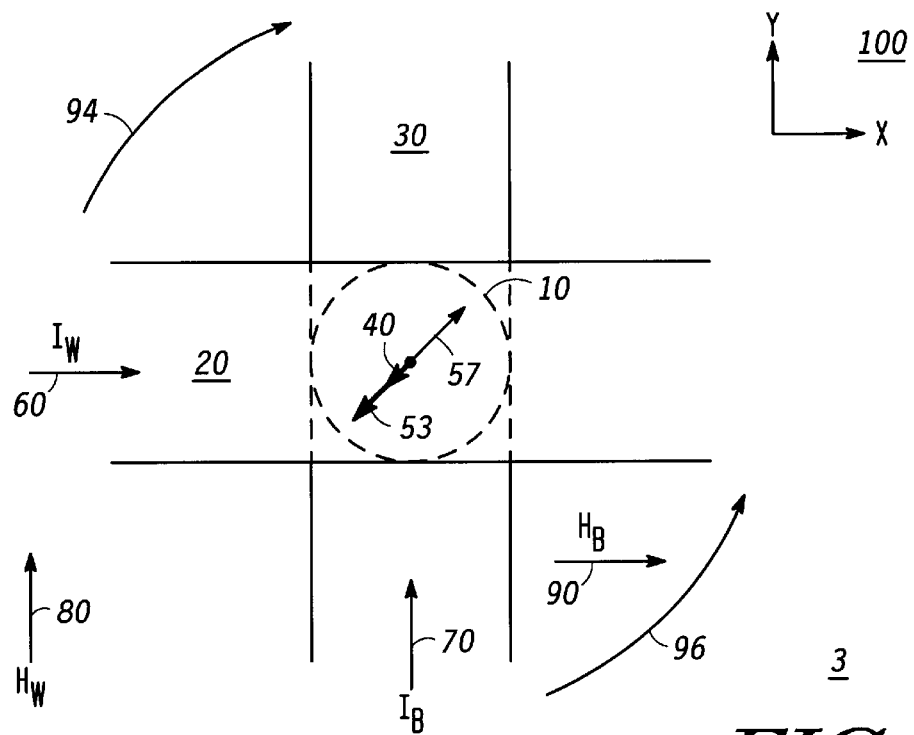
FIG. 2 is a simplified plan view of a magnetoresistive random access memory device with word and bit lines.

Turn now to FIG. 2, which illustrates a simplified plan view of an MRAM array 3. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In one form, a write word current 60 is defined as being positive if flowing in a positive x-direction and a write bit current 70 is defined as being positive if flowing in a positive y-direction. The purpose of write word line 20 and write bit line 30 is to create a magnetic field within MRAM device 10. A positive write word current 60 will induce a circumferential write word magnetic field, $H_w$ 80, and a positive write bit current 70 will induce a circumferential write bit magnetic field, $H_B$ 90. Since, in this example, write word line 20 is above MRAM device 10, in the plane of the element, $H_w$ 80 will be applied to MRAM device 10 in the positive y-direction for a positive write word current 60. Similarly, since write bit line 30 is below MRAM device 10, in the plane of the element, $H_B$ 90 will be applied to MRAM device 10 in the positive x-direction for a positive write bit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
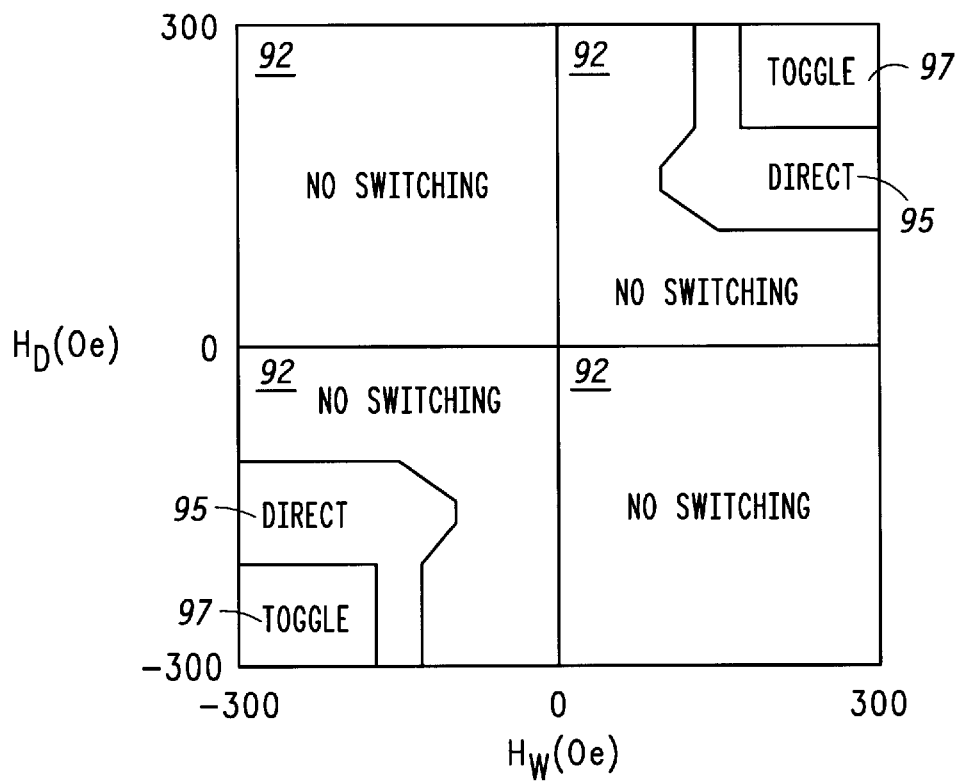
FIG. 3 is a graph illustrating a simulation of the magnetic field amplitude combinations that produce the direct or toggle write mode in the magnetoresistive random access memory device.
Figure 4:
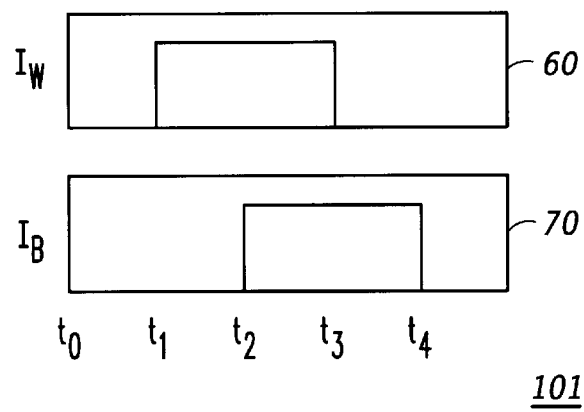

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the write word line magnetic field amplitude in Oersteds, and the y-axis is the write bit line magnetic field amplitude in Oersteds. The magnetic fields are applied in a pulse sequence 101 as shown in FIG. 4 wherein pulse sequence 101 includes write word current 60 and write bit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both write word line 20 and write bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the write word and write bit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both write word line 20 and write bit line 30. For example, if a '1' is initially stored then the state of the device will be switched to a '0' after one positive current pulse sequence is flowed through the write word and write bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in write word line 20 and write bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Turn now to FIG. 5 which illustrates the toggle write mode for writing a '1' to a '0' using pulse sequence 101. In this illustration at time $t_0$, magnetic moment vectors 53 and 57 are oriented in the preferred directions as shown in FIG. 2. This orientation will be defined as a '1'.

At a time $t_1$, a positive write word current 60 is turned on, which induces $H_w$ 80 to be directed in the positive y-direction. The effect of positive $H_w$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_w$ 80. Hence, magnetic moment vector 53 is rotated in the clockwise rotation direction 94. Since resultant magnetic moment vector 40 is the vector addition of magnetic moment vectors 53 and 57, magnetic moment vector 57 is also rotated in clockwise direction 94.

At a time $t_2$, positive write bit current 70 is turned on, which induces positive $H_B$ 90. Consequently, resultant magnetic moment vector 40 is being simultaneously directed in the positive y-direction by $H_w$ 80 and the positive x-direction by $H_B$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time $t_3$, write word current 60 is turned off so that now only $H_B$ 90 is directing resultant magnetic moment vector 40, which will now be oriented in the positive x-direction. Both magnetic moment vectors 53 and 57 will now generally be directed at angles past their anisotropy hard-axis instability points.

At a time $t_4$, write bit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time $t_0$ and is defined as '0'. Hence, MRAM device 10 has been switched to a '0'. It will be understood that MRAM device 10 could also be switched by rotating magnetic moment vectors 53, 57 and 40 by using negative currents in both write word line 20 and write bit line 30, but is shown otherwise for illustrative purposes.

Turn now to FIG. 6 which illustrates the toggle write mode for writing a '0' to a '1' using pulse sequence 101. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to '1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Turn now to FIG. 7 which illustrates an example of writing a '1' to a '0' using the direct write mode using pulse sequence 101. Here again, the memory state is initially a '1' with magnetic moment vector 53 directed 45° with respect to the negative x- and negative y-directions and magnetic moment vector 57 directed 45° with respect to the positive x- and positive y-directions. Following the pulse sequence as described above with positive write word current 60 and positive write bit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x- and positive y-directions as desired. Similar results are obtained when writing a '0' to a '1' only now with negative write word current 60 and negative write bit current 70.

Turn now to FIG. 8 which illustrates an example of writing using the direct write mode when the new state is the same as the state already stored. In this example, a '0' is already stored in MRAM device 10 and current pulse sequence 101 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant magnetic moment vector 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive magnetic moment vector 57 crosses the x-axis and the system stabilizes with the dominant magnetic moment vector 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both write word current 60 and write bit current 70 and, conversely, to write a '1' negative current is required for both write word current 60 and write bit current 70.

If larger fields are applied, eventually the energy decrease associated with a flop and scissor exceeds the additional energy barrier created by the dipole energy of the unbalanced moment that is preventing a toggle event. At this point, a toggle event will occur and the switching is described by region 97.

Region 95 in which the direct write mode applies can be expanded. For example region 97 can be moved to higher magnetic fields, if the times $t_3$ and $t_4$ are equal or made as close to equal as possible. In this case, the magnetic field direction starts at 45° relative to the bit anisotropy axis when write word current 60 turns on and then moves to parallel with the bit anisotropy axis when write bit current 70 turns on. This example is similar to the typical magnetic field application sequence. However, now write word current 60 and write bit current 70 turn off substantially simultaneously, so that the magnetic field direction does not rotate any further. Therefore, the applied field must be large enough so that the resultant magnetic moment vector 40 has already moved past its hard-axis instability point with both write word current 60 and write bit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
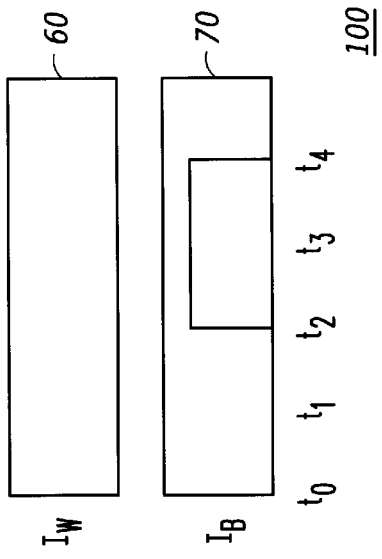
Figure 10:
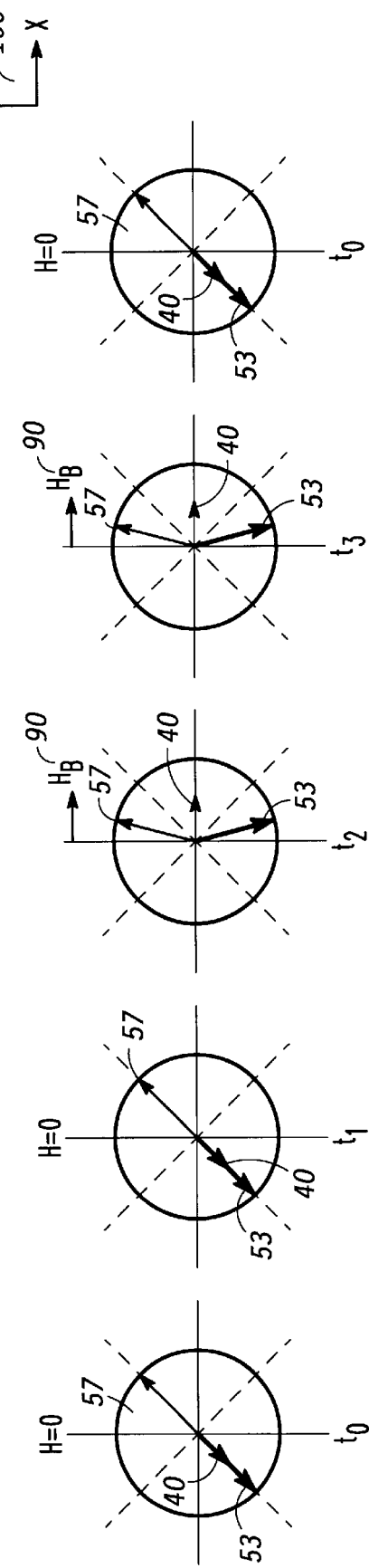

The writing methods described previously are highly selective because only the MRAM device that has both write word current 60 and write bit current 70 turned on between time $t_2$ and time $t_3$ will switch states. This feature is illustrated in FIGS. 9 and 10. FIG. 9 illustrates pulse sequence 101 when write word current 60 is not turned on and write bit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 101, write bit current 70 is turned on at a time $t_2$. During this time, $H_B$ 90 will cause resultant magnetic moment vector 40 to be directed in the positive x-direction.

Since write word current 60 is never switched on, resultant magnetic moment vectors 53 and 57 are never rotated through their anisotropy hard-axis instability points. As a result, magnetic moment vectors 53 and 57 will reorient themselves in the nearest preferred direction when write bit current 70 is turned off at a time $t_4$, which in this case is the initial direction at time $t_0$. Hence, the state of MRAM device 10 is not switched. It will be understood that the same result will occur if write word current 60 is turned on at similar times described above and write bit current 70 is not turned on. This feature ensures that only one MRAM device in an array will be switched, while the other devices will remain in their initial states. As a result, unintentional switching is avoided and the bit error rate is minimized.

It will be understood that the MRAM device 10 could also be switched by rotating the magnetic moment vectors using negative currents in both write word line 20 and write bit line 30.

Figure 11:
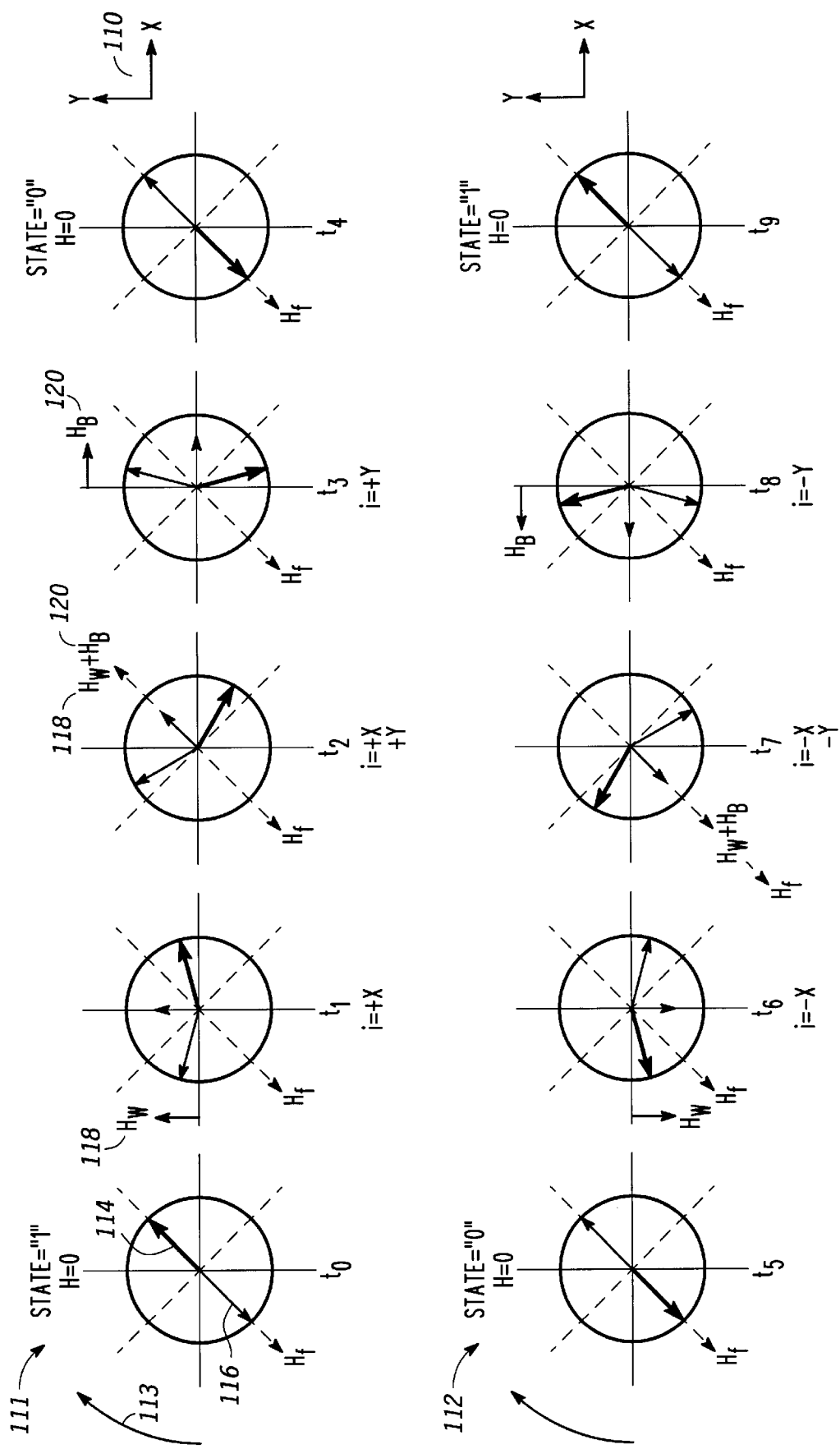
FIG. 11 is a diagram illustrating the rotation of the magnetic moment vectors for a memory using bidirectional write current programming.

Illustrated in FIG. 11 is a diagram of the rotation of the magnetic moment vectors for a memory using bidirectional write current programming for a first programming operation and a second programming operation. FIG. 11 illustrates the magnetic moment vectors during ten distinct time periods labeled t0 through t9. A sequence of transitions is used to illustrate two write operations, a first write operation using positive X-axis and Y-axis current direction on the word lines and bit lines, respectively, and a second write operation uses negative X-axis and Y-axis current direction on the word lines and bit lines, respectively. A write operation using positive X-axis and Y-axis current directions will be referred to as a first quadrant write operation where the X-axis and Y-axis form a four quadrant mapping. Similarly, a write operation using negative X-axis and Y-axis current directions will be referred to as a third quadrant write operation.

A first write operation 111 involves changing the state of a memory bit from a '0' value to a '1' using a first quadrant write operation, whereas a second write operation 112 involves changing the state of the memory bit from a '1' value to a '0' while changing direction of write currents to a third quadrant write as will be explained below. The chosen values of the bit being programmed in the two write operations are for illustration purposes only. Also, a clockwise movement 113 of the magnetic moment vectors is also selected for explanation purposes but the operation is analogous for counter-clockwise movement. All directions are referenced to an x- and y-coordinate system 110. All the illustrated diagrams of FIG. 11 are consistent with the structure of FIG. 1 wherein the location of the word line 20 that carries the x-axis current is above the bit and the location of the bit line 30 that carries the y-axis current is below the bit. Assume that a programmed memory state of '0' at time t0 is represented by magnetic moments 114 and 116 that respectively correspond to the polarization of free layers 55 and 45 of FIG. 1. In other words, the polarization of layers 45 and 55 is free or permitted to rotate. The fixed polarization of the tri-layer structure 19 is represented by Hf. By definition, state 0 is defined as magnetic moment 114 aligned anti-parallel with Hf and magnetic moment 116 aligned parallel with Hf. Conversely, state 1 is defined as magnetic moment 114 aligned parallel with Hf and magnetic moment 116 aligned anti-parallel with Hf.

At time t1 a word line current is applied oriented in a positive X-axis direction that results in a magnetic field Hw 118 oriented in the positive y-axis direction. The applied magnetic field Hw 118 rotates the magnetic moments 114 and 116 clockwise to align their resultant magnetic moment vector along the direction of Hw 118.

At time t2 an additional bit line current oriented in a positive Y-axis direction is applied. The additional bit line current results in a magnetic field $H_B$ 120 oriented along the positive X-axis direction. The resultant magnetic field vector, $H_w+H_B$, rotates the magnetic moments 114 and 116 clockwise to align their resultant magnetic moment vector along the same direction.

At time t3 the word line current is terminated. In the presence of only the bit line magnetic field $H_B$ the applied magnetic field becomes oriented along the positive X-axis direction. This applied magnetic field further rotates the magnetic moments 114 and 116 clockwise such that the resultant magnetic moment vector is oriented along the positive X-axis.

At time t4 the bit line current is terminated as well. In the absence of applied magnetic fields, the magnetic moments 114 and 116 rotate further clockwise to respectively align themselves parallel and anti-parallel with the bit polarization Hf. This completes the first write operation 111 wherein the bit has been programmed from a state '0' to a state '1' using positive write currents.

At a time t5, the programmed memory state is '1' and is represented by magnetic moments 114 and 116. The magnetic polarizations represented at time t5 is the same as time t4.

At time t6 a word line current is applied oriented in a negative X-axis direction that results in a magnetic field Hw 118 oriented in the negative y-axis direction. The applied magnetic field Hw 118 rotates the magnetic moments 114 and 116 clockwise to align their resultant magnetic moment vector along the direction of Hw 118.

At time t7 an additional bit line current oriented in a negative Y-axis direction is applied. The additional bit line current results in a magnetic field Hb 120 oriented along the negative X-axis direction. The resultant magnetic field vector, Hw+Hb, rotates the magnetic moments 114 and 116 clockwise to align their resultant magnetic moment vector along the same direction.

At time t8 the word line current is terminated. In the presence of only the bit line magnetic field Hb the applied magnetic field becomes oriented along the negative X-axis direction. This applied magnetic field further rotates the magnetic moments 114 and 116 clockwise such that the resultant magnetic moment vector is oriented along the negative X-axis.

At time t9 the bit line current is terminated as well. In the absence of applied magnetic fields, the magnetic moments 114 and 116 rotate further clockwise to respectively align themselves anti-parallel and parallel with the bit polarization Hf. This completes the second write operation 112 wherein the bit has been programmed from a state '1' to a state '0' using negative direction write currents.

Figure 12:
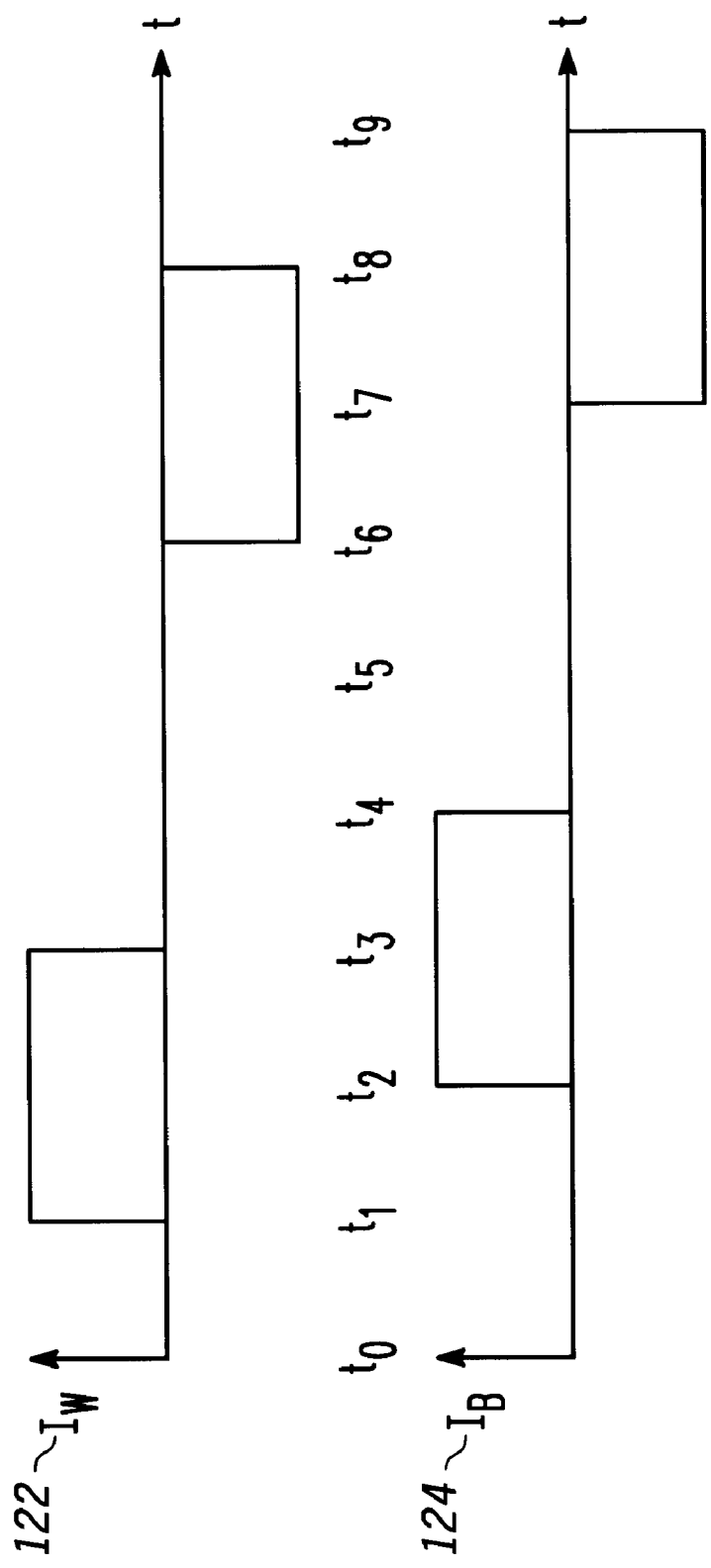
FIG. 12 is a graph illustrating the timing diagram of the word line current and the bit line current associated with the diagram of FIG. 11.

Illustrated in FIG. 12 is a timing diagram of the word line current and the bit line current associated with the diagram of FIG. 11. The write word line current $I_w$ 122 is shown in positive and negative form as a function of time. The write bit line current $I_B$ 124 is similarly illustrated. When these currents are asserted onto the write bit lines and write word lines in the polarity indicated and at the time indicated, the magnetic polarizations of FIG. 11 are realized. In the illustrated form, both write word line current 122 and write bit line current 124 are provided in the positive direction during time t1 to t4 and in the negative direction during time t6 to t9. Although the bit line and word line currents are applied in a specific sequence in this illustration, it should be understood that alternate sequences or simultaneous application of both currents may be used to implement bi-directional current programming.

Because magnetoresistive memories require high current densities for bit programming, the probability of EM failure in the memory write word and bit lines is increased. Alternating the current direction in the write word and bit lines as just described will significantly reduce the EM failure rate by reducing the average current density ($J_{ave}$). Discussed herein will be two techniques to provide alternating current directions through the memory write word and bit lines to reduce EM failures. It should be apparent that other techniques and methods may be used as well in connection with alternating the current direction.

The two techniques discussed below are in the context of any number of possible memory architectures. For purposes of illustration only, a specific memory architecture 1110 is described in FIG. 13.

Figure 13:
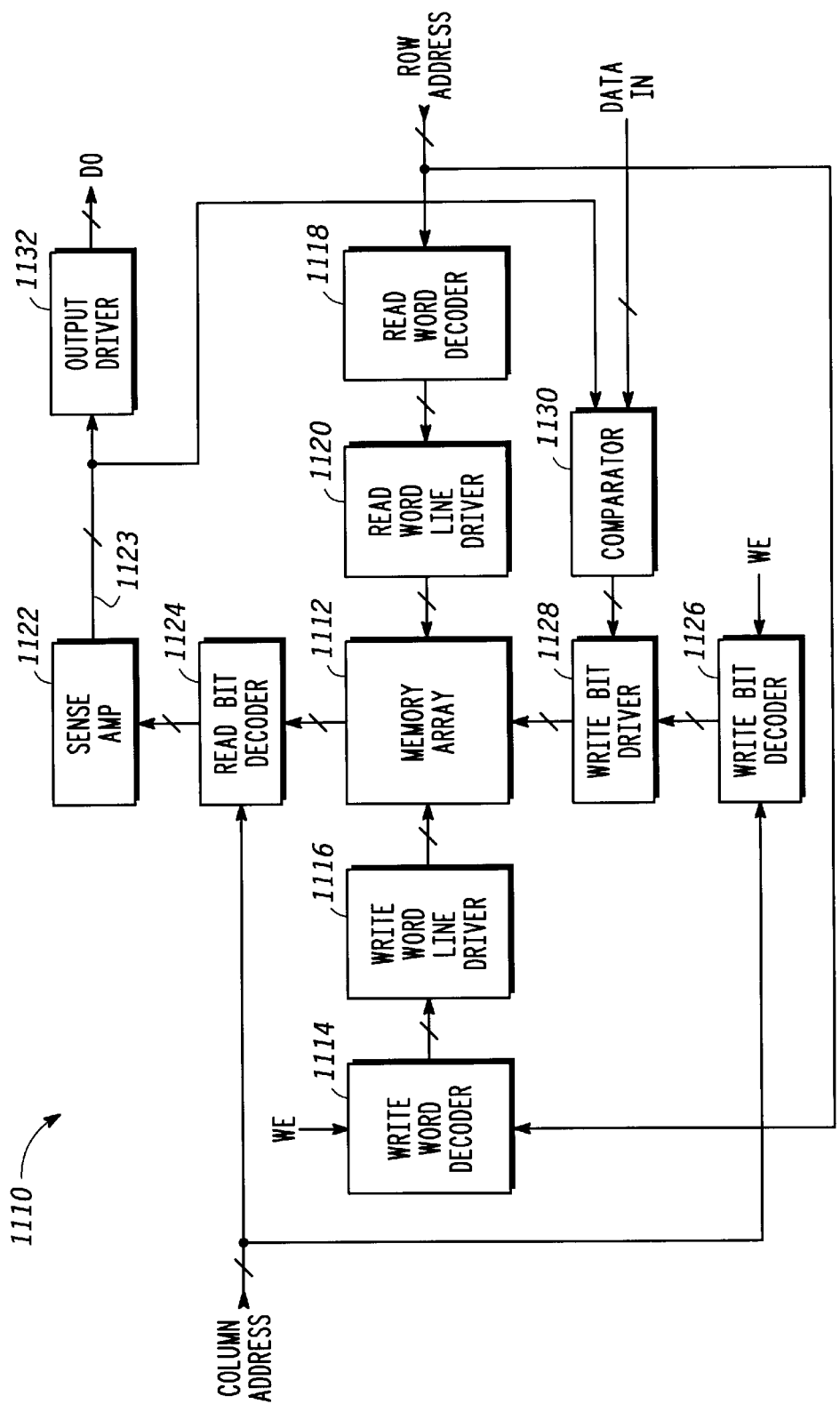
FIG. 13 is a block system diagram of a memory architecture for implementing the diagram of FIG. 11.

Illustrated in FIG. 13 is a memory 1110 comprising a memory array 1112, a write word decoder 1114, a write word line driver 1116, a read word decoder 1118, a read word line driver 1120, one or more sense amplifiers 1122, a read bit decoder 1124, a write bit decoder 1126, a write bit driver 1128, a comparator 1130, and an output driver 1132. These elements are coupled together by multiple lines. For example read bit decoder 1124 receives a column address made up of multiple address signals. Memory array 1112 is an array of memory cells that can be switched with a toggle operation. A section of memory cells for the memory array 1112 is an MRAM cell array where writing occurs in four steps of 45° angles until 180° is reached. In this particular preferred cell array, there are separate word lines and bit lines for a write operation and a read operation.

Read word decoder 1118 receives a row address and is coupled to read word line driver 1120, which in turn is coupled to memory array 1112. For a read, read word decoder 1118 selects a read word line in memory array 1112 based on the row address. The selected word line is driven by read word line driver 1120. Read bit decoder 1124, which receives the column address and is coupled between sense amplifier 1122 and memory array 1112, selects a read bit line from read bit decoder 1124, based on the column address, from memory array 1112 and couples it to sense amplifier 1122. Sense amplifier 1122 detects the logic state and couples it as sense amplifier output 1123 to output driver 1132 and comparator 1130. Output driver 1132, for a read, provides a data output signal DO. For a write operation, comparator 1130 compares the logic state of the selected cell, which is provided by sense amplifier 1122, to the desired logic state to be written as provided by the data in.

Write word decoder 1114 receives the row address and is coupled to write word line driver 1116, which in turn is coupled to memory array 1112. For a write, write word decoder 1114 selects a write word line, based on the row address, in memory array 1112, and write word line driver in turn drives that selected write word line. Write bit decoder 1126 receives the column address and is coupled to the write bit driver 1128, which is coupled to the memory array 1112. Writer bit decoder 1126 selects a write bit line, based on the column address, and write bit driver 1128 in turn drives the selected write bit line in order to toggle the state of the selected cell.

Since memory array 1112 is a toggle memory, a write toggling operation is completed only if the logic state of the cell needs to be flipped in order to achieve the desired resulting logic state for the selected cell. Thus, comparator 1130 receives the output of a read operation on the selected cell from sense amplifier 1122 and determines if the selected cell already has the desired logic state. If the selected cell, as determined by the row and column address, does have the desired logic state, then the write operation is terminated. If the logic state of the selected cell is different from the desired state then the comparator indicates to write bit driver 1128 that the write is to continue and the write bit driver for the selected write bit line drives the selected write bit line.

Figure 14:
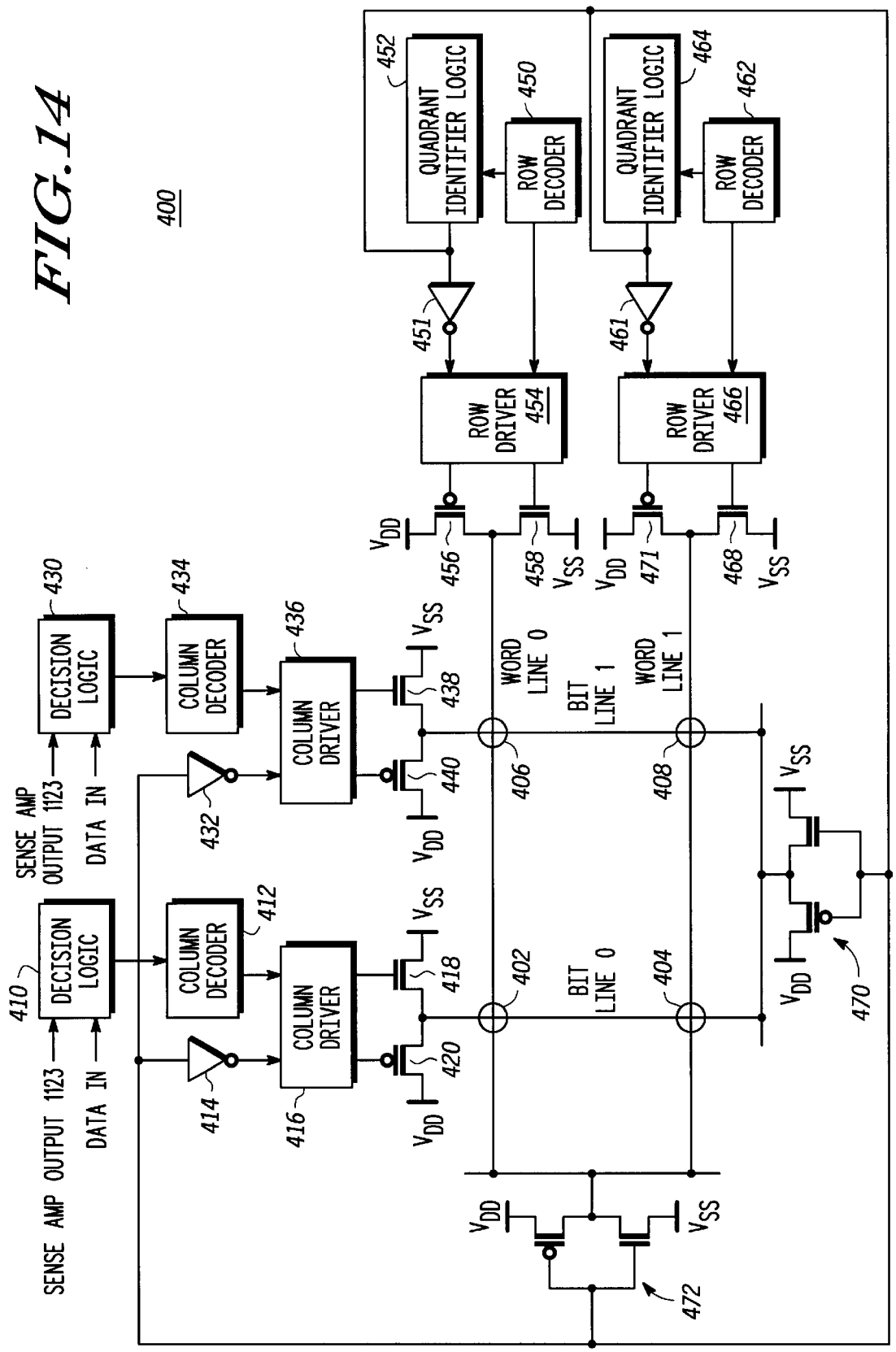
FIG. 14 is a partial schematic diagram of one form of a memory for implementing the diagram of FIG. 11.

Illustrated in FIG. 14 is a partial schematic diagram of one form of a memory 400 for implementing the diagram of FIG. 11. Memory cells 402, 404, 406 and 408 are each positioned at the intersection of a word line and a bit line. For example, memory cell 402 is at the intersection of word line 0 and bit line 0. Decision logic 410 has a first input for receiving the sense amplifier output 1123 of FIG. 13 and a second input for receiving the data bit to be written to memory 400 and designated as Data In. Similarly, decision logic 430 has a first input for receiving the sense amplifier output 1123 and a second input for receiving the Data In bit. An output of decision logic 410 is connected to an input of a column decoder 412. An output of decision logic 430 is connected to an input of a column decoder 434. An output of column decoder 412 is connected to a first input of a column driver 416. An output of column decoder 434 is connected to a first input of a column driver 436. An input of each of an inverter 414 and an inverter 432 is connected to an output of each of a quadrant identifier logic 452 and a quadrant identifier logic 464. An output of inverter 414 is connected to a second input of column driver 416. An output of inverter 432 is connected to a second input of column driver 436. A first output of column driver 416 is connected to a gate of a P-channel transistor 420. A source of transistor 420 is connected to a first power supply voltage terminal labeled $V_{DD}$ and a drain of transistor 420 is connected to a drain of an N-channel transistor 418. A gate of transistor 418 is connected to a second output of column driver 416. A source of transistor 418 is connected to a second power supply voltage terminal labeled $V_{SS}$. The first power supply voltage $V_{DD}$ is more positive than the second power supply voltage $V_{SS}$, which in one form is a ground reference. The drain of transistor 420 is connected to the Bit line 0.

A first output of column driver 436 is connected to a gate of a P-channel transistor 440. A source of transistor 440 is connected to a first power supply voltage terminal labeled $V_{DD}$ and a drain of transistor 440 is connected to a drain of an N-channel transistor 438. A gate of transistor 438 is connected to a second output of column driver 436. A source of transistor 438 is connected to a second power supply voltage terminal labeled $V_{SS}$. The drain of transistor 440 is connected to the Bit line 1.

A row decoder 450 has a first output connected to an input of quadrant identifier logic 452 and a second output connected to a first input of a row driver 454. The output of quadrant identifier logic 452 is connected to an inverter 451 in addition to an input of each of a driver 470 and a driver 472 and the inputs of inverter 414 and inverter 432. An output of inverter 451 is connected to a second input of row driver 454. An output of driver 470 is connected to each of the bit lines, and an output of driver 472 is connected to each of the word lines. A first output of row driver 454 is connected to a gate of a P-channel transistor 456, and a second output of row driver 454 is connected to a gate of an N-channel transistor 458. A source of transistor 456 is connected to the first power supply voltage terminal labeled $V_{DD}$, and a drain of transistor 456 is connected to a drain of transistor 458 and to word line 0. A source of transistor 458 is connected to the second power supply voltage terminal labeled $V_{SS}$.

A row decoder 462 has a first output connected to an input of quadrant identifier logic 464 and a second output connected to a first input of a row driver 466. The output of quadrant identifier logic 464 is connected to an inverter 461 in addition to the input of each of driver 470 and driver 472 and the inputs of inverter 414 and inverter 432. An output of inverter 461 is connected to a second input of row driver 466. A first output of row driver 466 is connected to a gate of a P-channel transistor 471, and a second output of row driver 466 is connected to a gate of an N-channel transistor 468. A source of transistor 471 is connected to the first power supply voltage terminal labeled $V_{DD}$, and a drain of transistor 471 is connected to a drain of transistor 468 and to word line 1. A source of transistor 468 is connected to the second power supply voltage terminal labeled $V_{SS}$.

In operation, memory 400 is illustrated having memory cells 402, 404, 406 and 408 formed by the intersection of respective bit lines and word lines. Memories contain millions of such memory cells formed by the intersection of bit lines and word lines and only four are illustrated herein for convenience of explanation. Row decoders 450 and 462 function to receive a decoded address. During a write operation a decoded address will activate one row decoder. Assume that row decoder 450 is activated. Row decoder 450 asserts a signal to row driver 454 and quadrant identifier logic 452. Quadrant identifier logic 452 is associated with word line 0, row decoder 450 and row driver 454 with transistors 456, 458. Quadrant identifier logic 464 is associated with word line 1, row decoder 462 and row driver 466 with transistor 471 and transistor 468. The quadrant identifier logic 452 functions to determine a desired write current quadrant for an upcoming programming operation by determining whether an applied write operation will be a first quadrant or a third quadrant write operation (i.e. determines the polarity of the write bit line current and write word line current). In order to make this determination, the output state value of the quadrant identifier logic 452 is toggled each time that its associated row decoder 450 is selected. In other words, quadrant identifier logic 452 changes the polarity of the currents every time a write operation is performed on its associated word line. Row driver 454 uses both the output of the asserted row decoder and an inversion of the output of quadrant identifier logic 452 to drive transistors 456 and 458 such that an appropriate current (i.e. to achieve either a quadrant one or a quadrant three write operation) is applied to word line 0. The output of quadrant identifier logic 452 also controls driver 472 such that the appropriate current is applied to word line 0.

Decision logic 410 and 430 function to compare the state of read data as received from the sense amplifier output 1123 with the data to be written (Data In) to the addressed memory cell to determine if a bit line current is necessary. If the Data In is equal to the read data, then no bit line current is applied. If the Data In is not equal to the read data, then bit line current is applied to toggle the state of the addressed memory cell. It should be noted that the decision logic does not determine the polarity of the current but only whether a bit line current is needed. Decision logic 410 is associated with bit line 0, column decoder 412 and column driver 416 with transistors 418, 420. Similarly, decision logic 430 is associated with bit line 1, column decoder 434 and column driver 436 with transistors 438, 440. Column decoders 412 and 434 function to receive a decoded address and the output of decision logic 410 and 430, respectively. During a write operation a decoded address and an asserted output from an associated decision logic will activate one column decoder. Assume that column decoder 412 is activated. Column decoder 412 asserts a signal to column driver 416. Column driver 416 uses the output of column decoder 412 and an inversion of the output of asserted quadrant identifier logic 452 to drive transistors 418 and 420 such that an appropriate current (i.e. to achieve either a quadrant one or a quadrant three toggle write operation) is applied to bit line 0. The output of asserted quadrant identifier logic 452 also controls driver 470 such that the appropriate current is applied to bit line 0. Therefore, it should be apparent that memory 400 functions to apply alternating quadrant write currents each time a write operation is performed on each word line, thus reducing the average current density, $J_{ave}$, for the word line to near zero. Each word line alternates polarity of the write currents to alternate the quadrants. It can be readily shown that the average current density, Jave, in each bit line is statistically decreased by alternating polarity of the write currents to alternate the quadrants.

Figure 15:
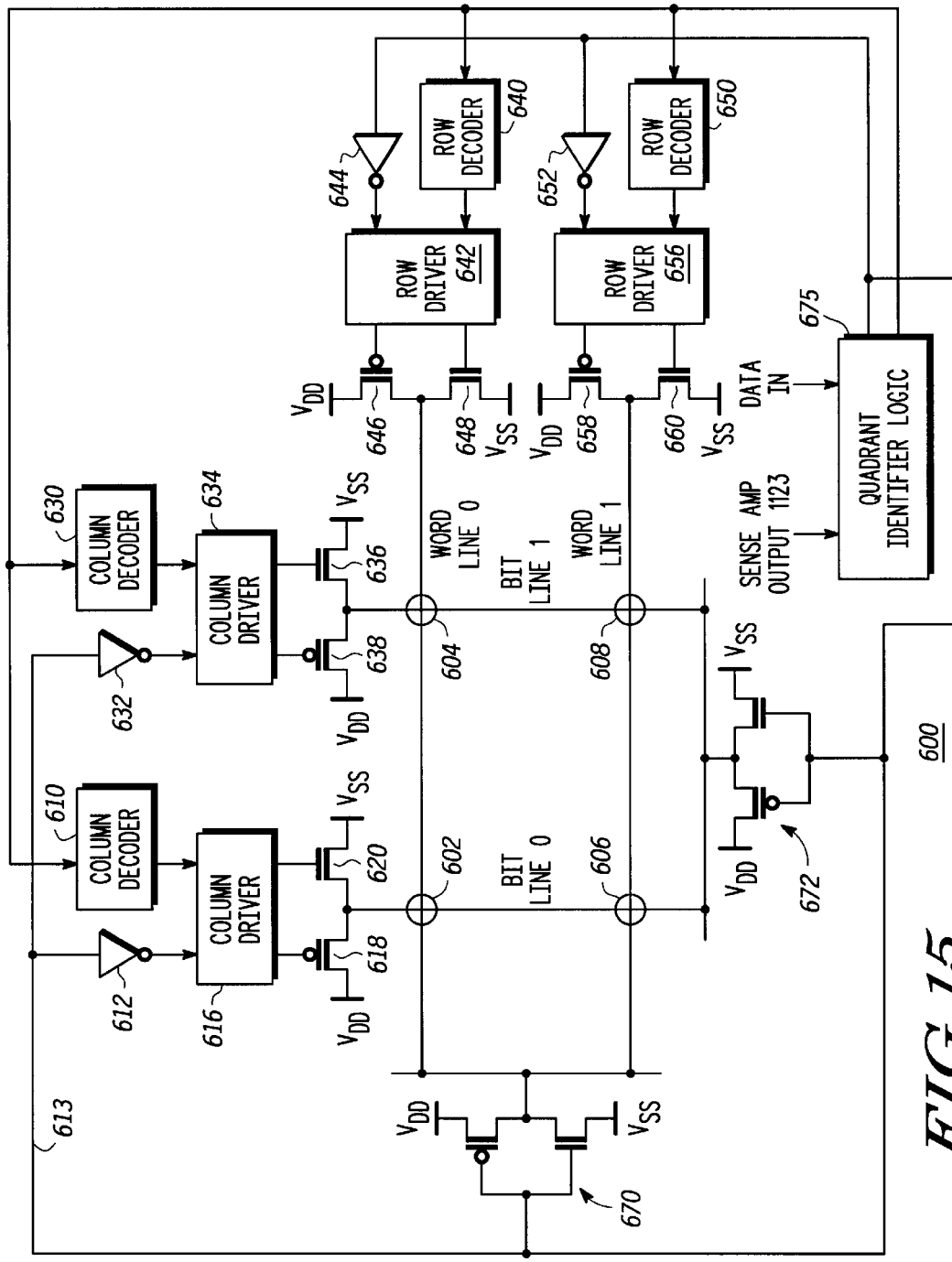
FIG. 15 is a partial schematic diagram of another form of a memory implementing the diagram of FIG. 11.

Illustrated in FIG. 15 is a partial schematic diagram of another form of a memory 600 for implementing the diagram of FIG. 11. Memory cells 602, 604, 606 and 608 are each positioned at the intersection of a word line and a bit line. For example, memory cell 602 is at the intersection of word line 0 and bit line 0. An input of each of a column decoder 610 and a column decoder 630 is connected to a first output of a quadrant identifier logic 675. An output of column decoder 610 is connected to a first input of a column driver 616. An output of column decoder 630 is connected to a first input of a column driver 634. An input of each of an inverter 612 and an inverter 632 is connected to a second output of quadrant identifier logic 675. An output of inverter 612 is connected to a second input of column driver 616. An output of inverter 632 is connected to a second input of column driver 634. A first output of column driver 616 is connected to a gate of a P-channel transistor 618. A source of transistor 618 is connected to a first power supply voltage terminal labeled $V_{DD}$ and a drain of transistor 618 is connected to a drain of an N-channel transistor 620. A gate of transistor 620 is connected to a second output of column driver 616. A source of transistor 620 is connected to a second power supply voltage terminal labeled $V_{SS}$. The first power supply voltage $V_{DD}$ is more positive than the second power supply voltage $V_{SS}$, which in one form is a ground reference. The drain of transistor 620 is connected to the Bit line 0.

A first output of column driver 634 is connected to a gate of a P-channel transistor 638. A source of transistor 638 is connected to a first power supply voltage terminal labeled $V_{DD}$ and a drain of transistor 638 is connected to a drain of an N-channel transistor 636. A gate of transistor 636 is connected to a second output of column driver 436. A source of transistor 636 is connected to a second power supply voltage terminal labeled $V_{SS}$. The drain of transistor 638 is connected to the Bit line 1.

A row decoder 640 has an input connected to the second output of quadrant identifier logic 675. An output of row decoder 640 is connected to a first input of a row driver 642. The first output of quadrant identifier logic 675 is connected to an input of an inverter 644. An output of inverter 644 is connected to a second input of row driver 642. A first output of row driver 642 is connected to a gate of a P-channel transistor 646, and a second output of row driver 642 is connected to a gate of an N-channel transistor 648. A source of transistor 646 is connected to the first power supply voltage terminal labeled $V_{DD}$, and a drain of transistor 646 is connected to a drain of transistor 648 and to word line 0. A source of transistor 648 is connected to the second power supply voltage terminal labeled $V_{SS}$.

A row decoder 650 has an input connected to the second output of quadrant identifier logic 675. An output of row decoder 650 is connected to a first input of a row driver 656. The first output of quadrant identifier logic 675 is connected to an input of an inverter 652. An output of inverter 652 is connected to a second input of row driver 656. A first output of row driver 656 is connected to a gate of a P-channel transistor 658, and a second output of row driver 656 is connected to a gate of an N-channel transistor 660. A source of transistor 658 is connected to the first power supply voltage terminal labeled $V_{DD}$, and a drain of transistor 658 is connected to a drain of transistor 660 and to word line 1. A source of transistor 660 is connected to the second power supply voltage terminal labeled $V_{SS}$.

The first output of quadrant identifier logic 675 is connected to an input of a driver 672 and to an input of a driver 670. An output of driver 672 is connected to each bit line, and an output of driver 670 is connected to each word line. In one form drivers 670 and 672 are illustrated as conventional MOS buffers but various other driver circuitry may be used. Quadrant identifier logic 675 has a first input for receiving the data value of the sense amplifier output 1123 and a second input for receiving a data bit to be written and referred to as Data In.

In operation, memory 600 is illustrated having memory cells 602, 604, 606 and 608 formed by the intersection of respective bit lines and word lines. The quadrant identifier logic 675 has a first output that functions to determine whether an applied write operation will be a first quadrant or a third quadrant write operation to an addressed row or column (i.e. determines the polarity of the write bit line current and write word line current) and a second output that functions to determine whether any current will be applied to an addressed row and column. The logic state of the Data In signal determines the value of the first output. In order to determine the second output, the quadrant identifier logic 675 compares the sense amplifier output 1123 to the data being written (Data In). If the Data In is equal to the read data, then no current is applied to either the selected bit line or the word line. If the Data In is not equal to the read data, a write current will be applied to the selected word line and bit line. Therefore, the polarity of write currents for the word line and bit line associated with a memory cell alternates each time current is applied to toggle the state of the memory cell. For example, if a logic one is the value of Data In and the read data associated with the addressed bit is a logic zero, then a first quadrant current write operation is applied. Subsequently if a logic zero is the value of Data In and the read data associated with the addressed bit is a logic one, then a third quadrant current write operation is applied. If the logic state of Data In is kept constant for multiple write operations to a memory cell, then no current is applied after the first time that the memory cell changes state.

Row decoders 640 and 650 function to receive a decoded address and the second output of quadrant identifier logic 675. During a write operation a decoded address and an asserted second output from the quadrant identifier logic 675 will activate one row decoder. Assume that row decoder 640 is selected. Row decoder 640 asserts a signal to row driver 642 to identify a decoded word line.

Row driver 642 uses both the output of the asserted row decoder 640 and an inversion of the first output of quadrant identifier logic 675 to drive transistors 646 and 648 such that an appropriate current (i.e. to achieve either a quadrant one or a quadrant three write operation) is applied to word line 0. The first output of quadrant identifier logic 675 also controls driver 670 such that the appropriate current is applied to word line 0.

Column decoders 610 and 630 function to receive a decoded address and the second output of quadrant identifier logic 675. During a write operation a decoded address and an asserted second output from quadrant identifier logic 675 will activate one column decoder. Assume that column decoder 610 is selected. Column decoder 610 asserts a signal to column driver 616. Column driver 616 uses the output of column decoder 610 and an inversion of the first output of quadrant identifier logic 675 to drive transistors 618 and 620 such that an appropriate current (i.e. to achieve either a quadrant one or a quadrant three write operation) is applied to bit line 0. The first output of quadrant identifier logic 675 also controls driver 672 such that the appropriate current is applied to bit line 0. Therefore, it should be apparent that memory 600 functions to apply alternating quadrant write currents each time a write operation is performed on each memory cell, thus reducing the average current density, $J_{ave}$, for both the word line and the bit line to near zero. For example, each time the state of a memory cell is changed from logic zero to logic one, a first quadrant write operation is applied. Each time the state of the memory cell is changed from a logic one to a logic zero, a third quadrant write operation is applied. Since no current is applied when the state of the memory cell is not to be changed, an equal number of quadrant one and quadrant three current write operations will be applied to each word line and bit line after many write operations are performed.

By now it should be apparent that there has been provided a magnetic memory that is programmed by using bi-directional write currents to minimize EM degradation. Various types of magnetic memory cells may be used in connection with the bi-directional current writing. In another form of magnetic memory, a current in either direction in a word line, usually referred in magnetic memories as a hard axis, is used to select bits on that word line. Similarly, current in a bit line, usually referred to in magnetic memories as an easy axis, is used to directly write data into the bit. Current in the bit line in a first direction writes a logic one and current in a second direction opposite to the first direction writes a logic zero. Since current in either direction can be used to select bits on a word line, only one direction is conventionally used. In this innovation, the current in word lines in this type of memory are reversed based on criteria that minimize an average current density in the word lines. Example criteria include: (1) reversing the current in a word line on each use; (2) making the word line current direction dependent on the value of the data to be written; and (3) making the word line current direction dependent on both the value of the data to be written and the current value of the memory cell. Other criteria can be readily selected, such as a random condition such as a counter value based on a clock signal.

Therefore, electromigration is reduced in the word lines. Since the bit line current direction is already dependent on the data to be written, the currents in the bit line automatically reverse.

Various changes and modifications to the embodiments herein chosen for purposes of illustration will readily occur to those skilled in the art. For example, the size and complexity of the memory can be varied depending upon a specific need. The circuitry may be implemented in MOS, GaAs and other semiconductor technologies. While the quadrant identifier logic selects between a first and a third quadrant in the discussions above, a selection between a second and a fourth quadrant could be implemented. To the extent that such modifications and variations do not depart from the spirit of the invention, they are intended to be included within the scope thereof which is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for programming a magnetic memory having a plurality of word lines and a plurality of bit lines comprising:

conducting a first write word line current in a first direction through a predetermined one of the plurality of word lines;

conducting a first write bit line current in a second direction through a predetermined one of the plurality of bit lines to complete a first programming operation of the magnetic memory;

determining directions of write currents for a subsequent second programming operation; and performing the subsequent second programming operation by conducting the first write word line current in a third direction and conducting the first write bit line current in a fourth direction, the third direction being opposite the first direction and the fourth direction being opposite the second direction.

2. The method of claim 1 further comprising:
determining directions of write currents by determining a desired write current quadrant based on a value of a data bit to be programmed during the subsequent second programming operation.

3. The method of claim 1 further comprising:
determining directions of write currents by determining a desired write current quadrant based on both a value of a data bit to be programmed during the subsequent second programming operation and a value of a presently stored data bit at a memory cell being accessed for programming.

4. The method of claim 1 further comprising:
determining directions of write currents by determining a desired write current quadrant based on a prior write current quadrant.

5. The method of claim 1 further comprising:
determining directions of write currents by determining a desired write current quadrant based on a value of a preceding programming operation of the magnetic memory.

6. The method of claim 1 further comprising:
determining directions of write currents by determining a desired write current quadrant based on a value of a most recent polarization state of a last programming operation.

7. The method of claim 1 further comprising:
determining directions of write currents by determining a desired write current quadrant based on a value of a most recent write current quadrant state of a prior programming operation using either a decoded word line or a decoded bit line.

8. The method of claim 1 further comprising:
determining directions of write currents by determining a desired write current quadrant based on a randomly generated value.

9. A method for programming a magnetic memory having a plurality of word lines and a plurality of bit lines comprising:
selectively conducting current in a first direction in one of the plurality of word lines and selectively conducting current in either a second direction or a third direction opposite the second direction in one of the plurality of bit lines in order to implement a first programming operation; and
selectively conducting current in a fourth direction opposite the first direction in the one of the plurality of word lines and selectively conducting current in either the second direction or the third direction in the one of the plurality of bit lines for implementing a second programming operation, wherein reversing of current direction in both of the plurality of word lines and the plurality of bit lines reduces electromigration effects in the plurality of word lines and the plurality of bit lines.

10. The method of claim 9 further comprising:
determining current direction of the one of the plurality of bit lines and the one of the plurality of word lines based on one of: (1) a value of a data bit to be programmed; (2) both a value of the data bit to be programmed and a value of a presently stored data bit at a predetermined memory cell; and (3) a value of a most recent current direction of a prior programming operation using either a decoded word line or a decoded bit line.

11. The method of claim 9 further comprising:
determining current direction of the one of the plurality of bit lines and the one of the plurality of word lines based on bit line current direction and word line current direction of a preceding programming operation of the magnetic memory.

12. A magnetic memory having a plurality of word lines and a plurality of bit lines comprising:
an array of memory cells formed at intersections of the plurality of word lines and the plurality of bit lines;
decoding circuitry coupled to the array of memory cells for selectively reading and writing the array of memory cells; and
logic circuitry coupled to the decoding circuitry for conducting a first write word line current in a first direction through a predetermined one of the plurality of word lines, conducting a first write bit line current in a second direction through a predetermined one of the plurality of bit lines to complete a first programming operation of the magnetic memory, determining a desired write current quadrant for a subsequent second programming operation and controlling the subsequent second programming operation by conducting the first write word line current in a third direction and conducting the first write bit line current in a fourth direction, the third direction being opposite the first direction and the fourth direction being opposite the second direction.

13. The magnetic memory of claim 12 wherein the logic circuitry determines the desired write current quadrant from one of: (1) a value of a data bit to be programmed; (2) both a value of the data bit to be programmed and a value of a presently stored data bit at a predetermined memory cell; and (3) a value of a most recent current direction of a prior programming operation using either a decoded word line or a decoded bit line.

14. The magnetic memory of claim 12 wherein the logic circuitry further determines values for the first direction, second direction, third direction and fourth direction based on bit line current direction and word line current direction of a preceding programming operation of the magnetic memory.

15. A magnetic memory having a plurality of word lines and a plurality of bit lines comprising:
an array of memory cells formed at intersections of the plurality of word lines and the plurality of bit lines;
decoding circuitry coupled to the array of memory cells for selectively reading and writing the array of memory cells; and
logic circuitry coupled to the decoding circuitry for conducting a first write word line current in a first direction through a predetermined one of the plurality of word lines, conducting a first write bit line current in a second direction or a third direction opposite the second direction through a predetermined one of the plurality of bit lines to complete a first programming operation of the magnetic memory, determining a desired word line write current direction for a subsequent second programming operation and controlling the subsequent second programming operation by conducting the first write word line current in a fourth direction and conducting the first write bit line current in one of the second direction or the third direction, the fourth direction being opposite the first direction.

16. The magnetic memory of claim 15 wherein the logic circuitry determines the desired word line write current direction from one of: (1) a value of a data bit to be programmed; (2) both a value of the data bit to be programmed and a value of a presently stored data bit at a predetermined memory cell; and (3) a value of a most recent current direction of a prior programming operation using a decoded word line.

17. The magnetic memory of claim 15 wherein the logic circuitry determines values of the first direction, second direction, third direction and fourth direction based on bit line current direction and word line current direction of a preceding programming operation of the magnetic memory.

\* \* \* \* \*